(12) United States Patent
Lakshmanan et al.

(10) Patent No.: US 10,132,884 B2
(45) Date of Patent: Nov. 20, 2018

(54) CIRCULAR DIPOLE AND SURFACE COIL LOOP STRUCTURES AND METHODS FOR USING THE SAME

(71) Applicant: NEW YORK UNIVERSITY, New York, NY (US)

(72) Inventors: Karthik Lakshmanan, Jersey City, NJ (US); Martijn Cloos, New York, NY (US); Graham Charles Wiggins, New York, NY (US)

(73) Assignee: New York University, New York, NY (US)

( * ) Notice: Subject to any disclaimer, the term of this patent is extended or adjusted under 35 U.S.C. 154(b) by 845 days.

(21) Appl. No.: 14/543,053

(22) Filed: Nov. 17, 2014

(65) Prior Publication Data

US 2015/0137815 A1 May 21, 2015

Related U.S. Application Data

(60) Provisional application No. 61/904,932, filed on Nov. 15, 2013.

(51) Int. Cl.
*G01V 3/00* (2006.01)
*G01R 33/341* (2006.01)
*G01R 33/34* (2006.01)
*G01R 33/3415* (2006.01)
*H01Q 9/26* (2006.01)
*H01Q 21/08* (2006.01)

(52) U.S. Cl.
CPC ....... *G01R 33/341* (2013.01); *G01R 33/3415* (2013.01); *G01R 33/34038* (2013.01); *H01Q 9/265* (2013.01); *H01Q 21/08* (2013.01)

(58) Field of Classification Search
CPC ............ G01R 33/341; G01R 33/34038; G01R 33/3415; H01Q 9/265; H01Q 21/08
USPC .................................. 324/322; 333/219–235
See application file for complete search history.

(56) References Cited

U.S. PATENT DOCUMENTS

| | | | | |
|---|---|---|---|---|
| 5,068,672 A | * | 11/1991 | Onnigian | H01P 5/10 343/821 |
| 5,202,635 A | * | 4/1993 | Srinivasan | G01R 33/34046 324/318 |
| 6,164,241 A | * | 12/2000 | Chen | H01J 37/321 118/723 I |
| 2013/0257676 A1 | * | 10/2013 | Kerselaers | H01Q 1/273 343/860 |

(Continued)

OTHER PUBLICATIONS

Raaijmakers, Alexander et al., "Dipole Antenna without Ceramic Substrate and Still low SAR: The Fractionated Dipole Antenna," Proc. Intl. Soc. Mag. Reson. Med., vol. 21, p. 4382, 2013.

(Continued)

*Primary Examiner* — Susan Lee
(74) *Attorney, Agent, or Firm* — Hunton Andrews Kurth LLP

(57) ABSTRACT

A circular dipole antenna (e.g., for a magnetic imaging system) according to exemplary embodiments of the present disclosure can comprise a circular conductor with a feed point on one side and a gap on the other. A surface coil loop antenna (e.g., for magnetic imaging system) is provided with a capacitor arrangement selected for non-uniform or unbalanced current distribution, with corresponding magnetic and electric dipole fields provided in a single structure referred to as a loopole.

24 Claims, 23 Drawing Sheets

(56) References Cited

U.S. PATENT DOCUMENTS

2015/0168515 A1* 6/2015 Ishihara ............. G01R 33/3685
324/322

OTHER PUBLICATIONS

Graessl, Andreas et al., "A Two-Dimenional 16 Channel Dipole Transceiver Array for Cardiac MR at 7.0 T: Design, Evaluation of RF Shimming Behavior and Application in CINE Imaging," Pro. Intl. Soc. Mag. Reson. Med., vol. 21, p. 0395, 2013.

Raaijmakers, A.J.E. et al., "Design of a Radiactive Surface Coil Array Element at 7 T: The Single-Side Adapted Dipole Antenna," Magnetic Resonance in Medicine, vol. 66, pp. 1488-1497, 2011.

Zhang, Bei et al., "Why Does the Radiative Antenna Have No B1 Twisting at 7T? Framework for and Applications of a Conceptional "Mirror Current" Model of Coil-Tissue Interactions," Proc. Intl. Soc. Mag. Reson., vol. 20, p. 2816, 2012.

Horner, F. et al., "Properties of Loop Aerials," The Wireless Engineer, vol. 25, pp. 254-259, Aug. 1948.

Schnell, Wilfried et al., "Ultimate Signal-to-Noise-Ratio of Surface and Body Antennas for Magnetic Resonance Imaging," IEEE Transactions on Antennas and Propagation, vol. 48, No. 3 , pp. 418-428, Mar. 2000.

Wiggins, Graham Charles et al., "Mixing Loops and Electric Dipole Antennas for Increased Sensitivity at 7 Tesla," Proc. Intl. Soc. Mag. Reson. Med., vol. 21, p. 2737, 2013.

Eryaman, Yigitcan et al., "Combined Loop + Dipole Arrays for 7 T Brain Imaging," Proc. Intl. Soc. Mag. Reson. Med., vol. 21, p. 0393, 2013.

Klose, Uwe, "Mapping of the Radio Frequency Magnetic Field with a MR Snapshot Flash Technique," Med. Phys., vol. 19, No. 4, pp. 1099-1104, Jul./Aug. 1992.

Yarnykh, Vasily L., "Actual Flip-Angle Imaging in the Pulsed Steady State: A Method for Rapid Three-Dimensional Mapping of the Transmitted Radiofrequency Field," Magnetic Resonance in Medicine, vol. 57, pp. 192-200, 2007.

Lakshmanan, Karthik et al., "The Loopole Antenna: Capturing Magnetic and Electric Dipole Fields with a Single Structure to Improve Transmit and Receive Performance," Proc. Intl. Soc. Mag. Reson. Med., vol. 22, p. 0397, 2014.

Lakshmanan, Karthik et al., "The Circular Dipole," Proc. Intl. Soc. Mag. Reson. Med., vol. 22, p. 0315, 2014.

Lee, Wonje et al., "A New UHF Transceiver Antenna Design: Modified Folded Dipole," Proc. Intl. Soc. Mag. Reson. Med., vol. 21, p. 4367, 2013.

Duan, Q. et al., "Optimizing 7T Spine Array Design Through Offsetting of Transmit and Receive Elements and Quadrature Excitation," Proc. Intl. soc. Mag. Reson. Med., vol. 18, p. 51, 2010.

Duan, Q. et al., "Array RF Transmitter for 7T MRI of the Spine Based on Dipole Antennas," Proc. Intl. Soc. Mag. Med., vol. 22, p. 0316, 2014.

Wiggins, G. et al., "B1+ and SNR Optimization of High Field RF Coils Through Offsetting of Transmit and Receive Elements," Proc. Intl. Soc. Mag. Reson. Med., vol. 17, p. 2951, 2009.

\* cited by examiner

FIG. 1A
FIG. 1B
Circular Dipole
Straight Dipole
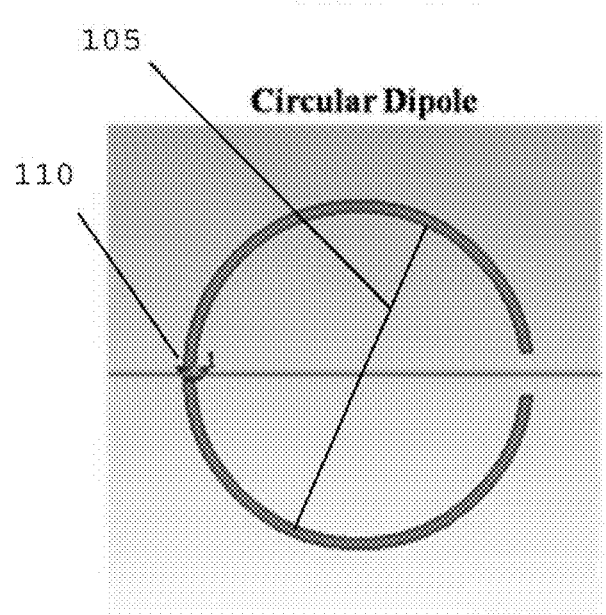
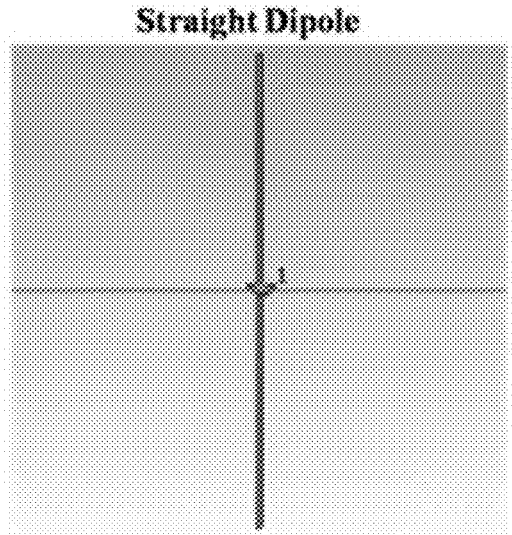

Circular Dipole

Straight Dipole

Circular Dipole

Straight Dipole

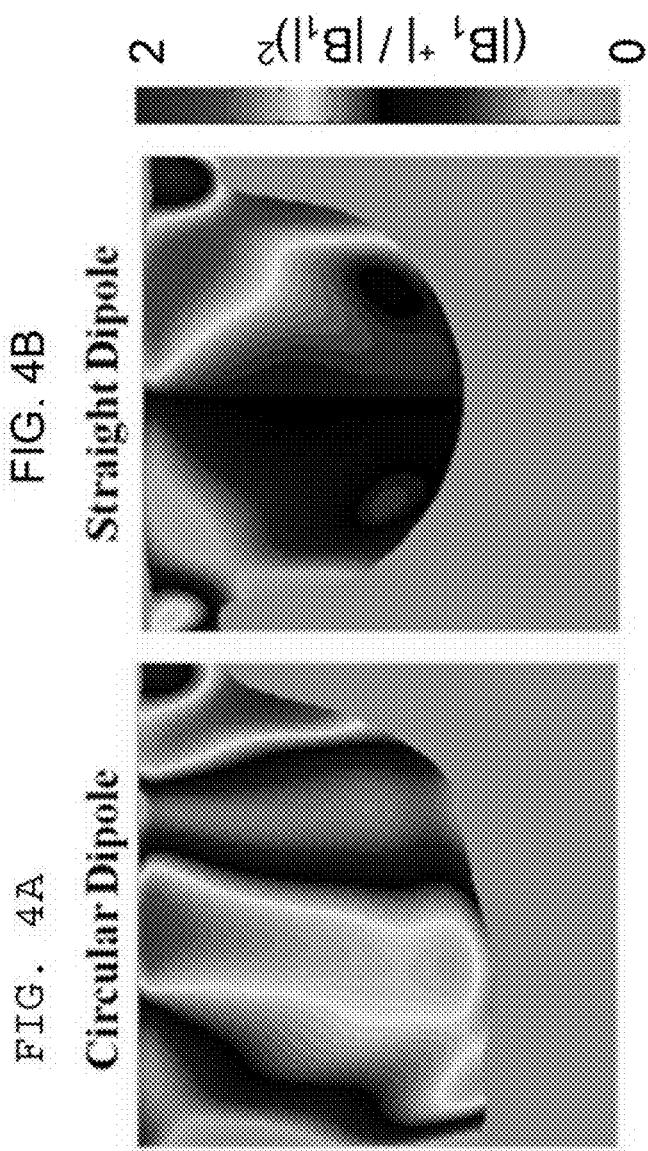

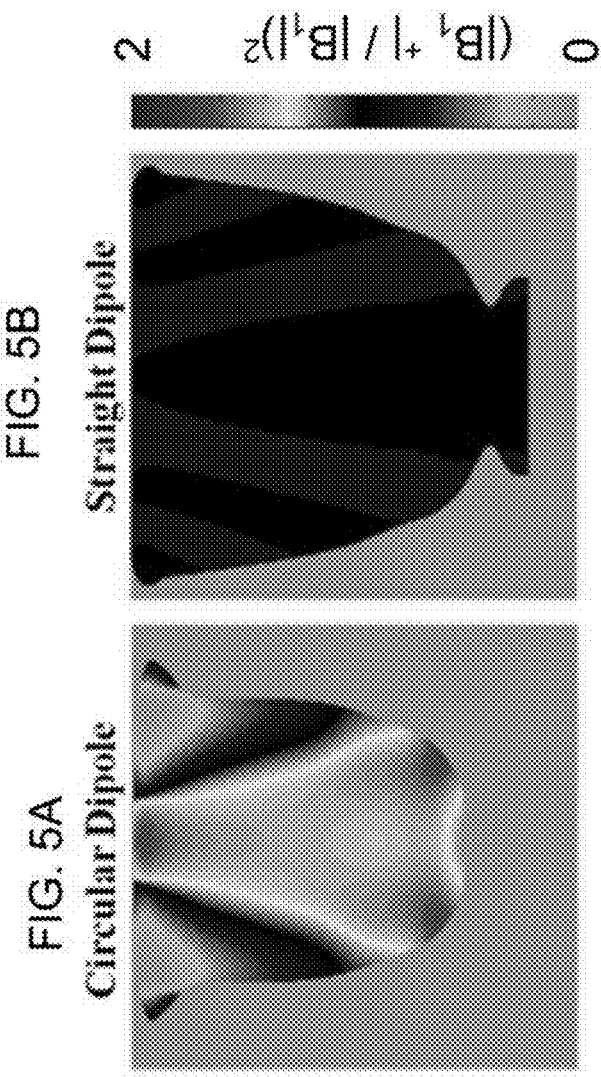

Circular Dipole

Straight Dipole

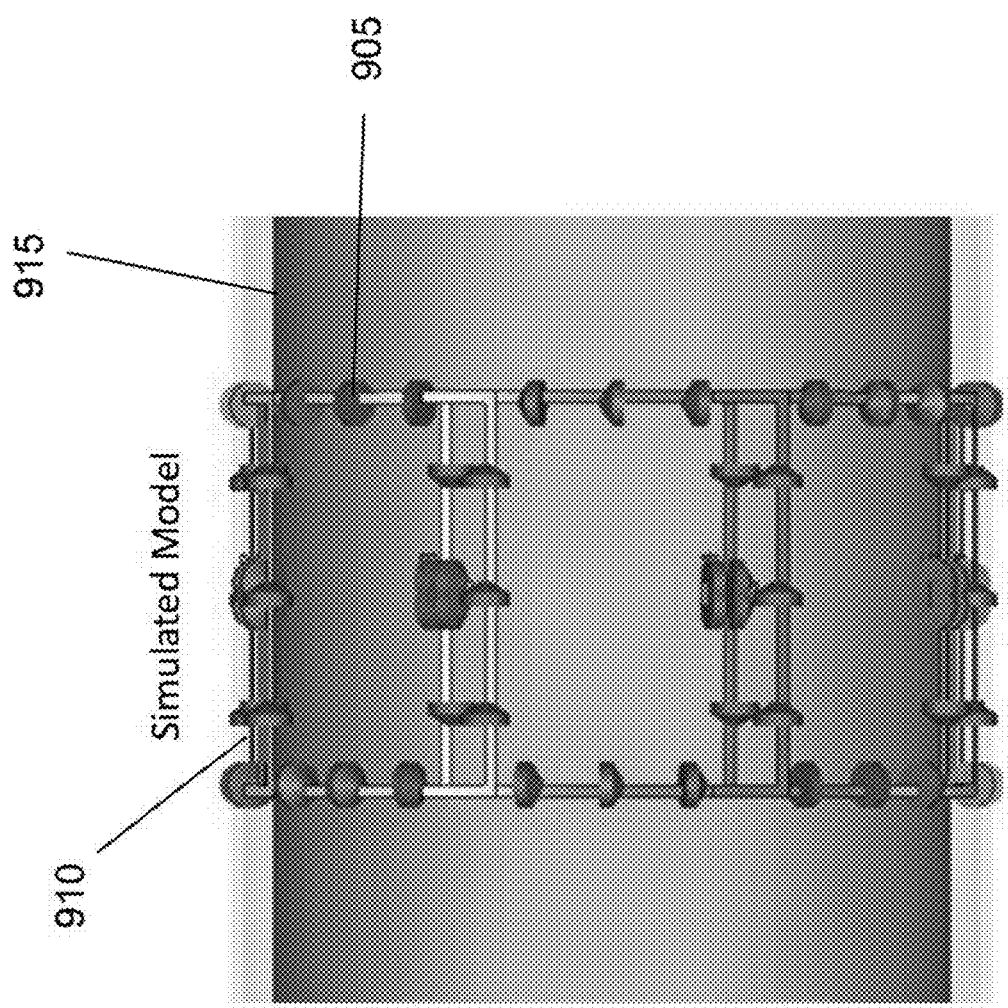

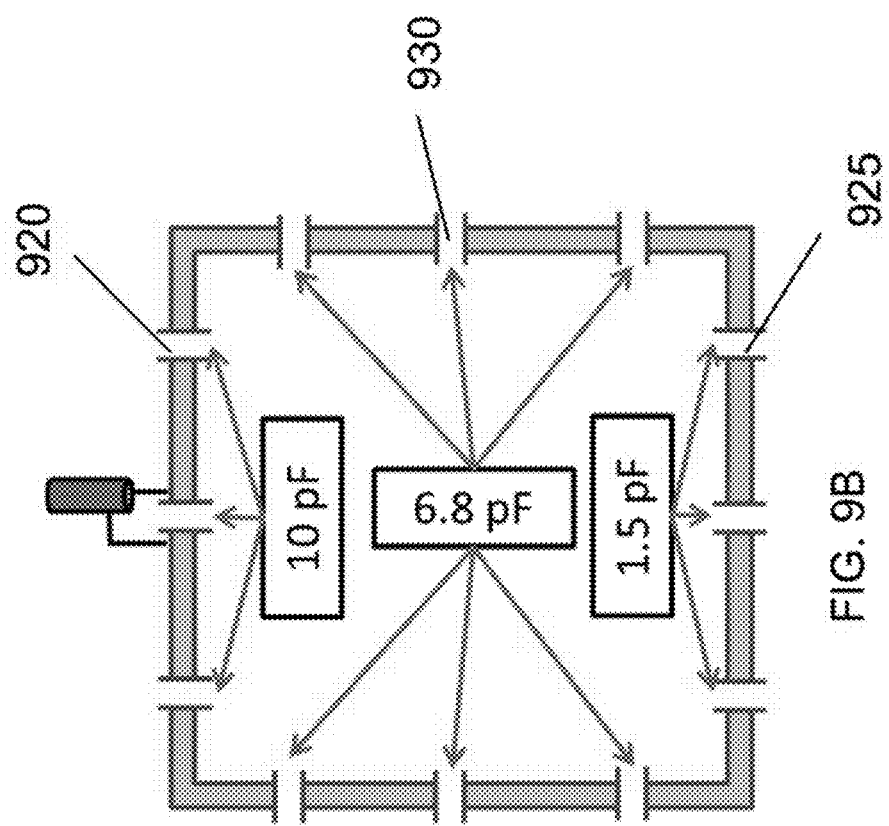

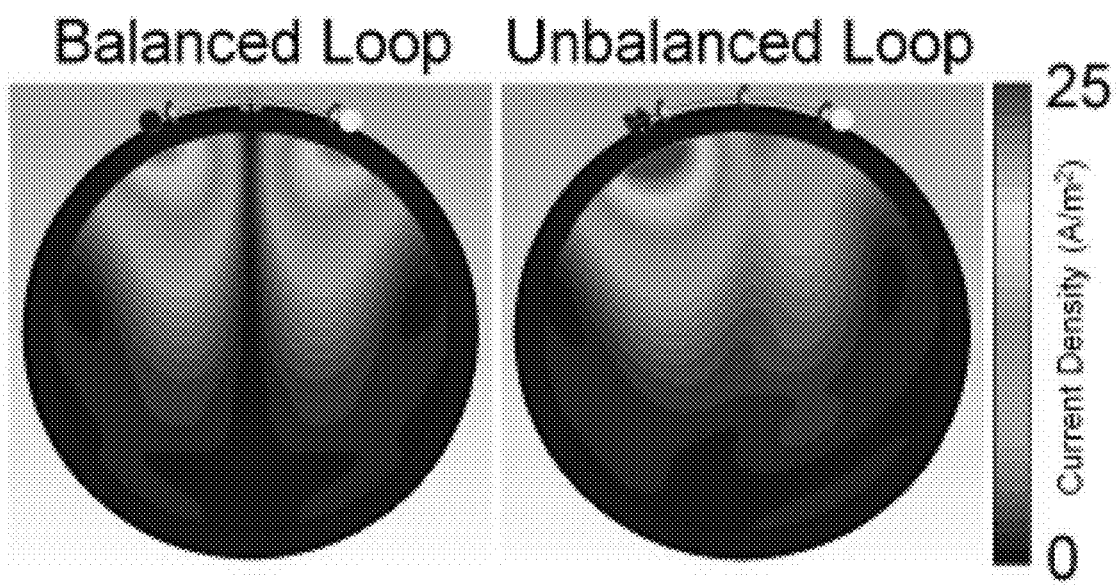

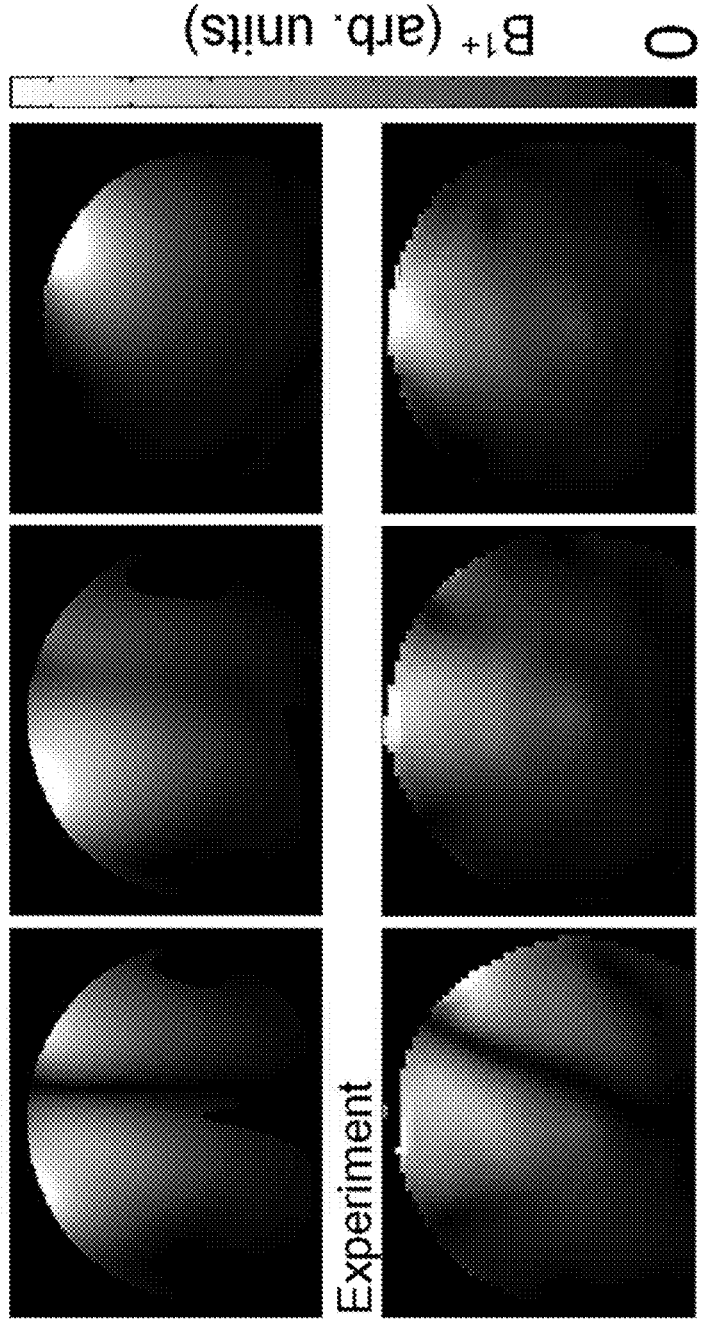

$B_1^+$ Maps - Simulations
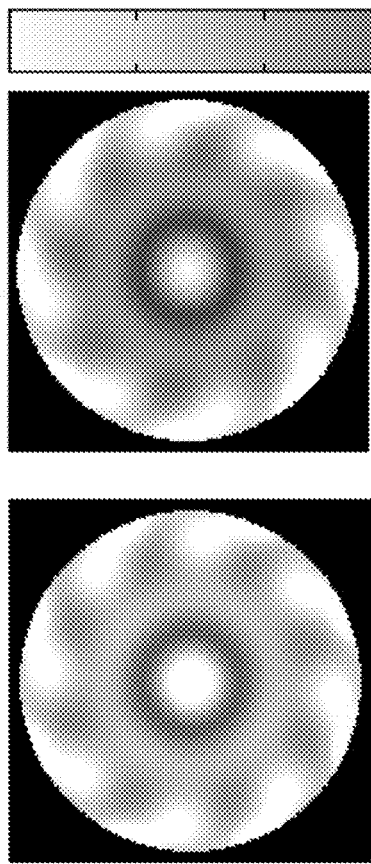
FIG. 13A Balanced
FIG. 13B Unbalanced
FIG. 13C Dipoles
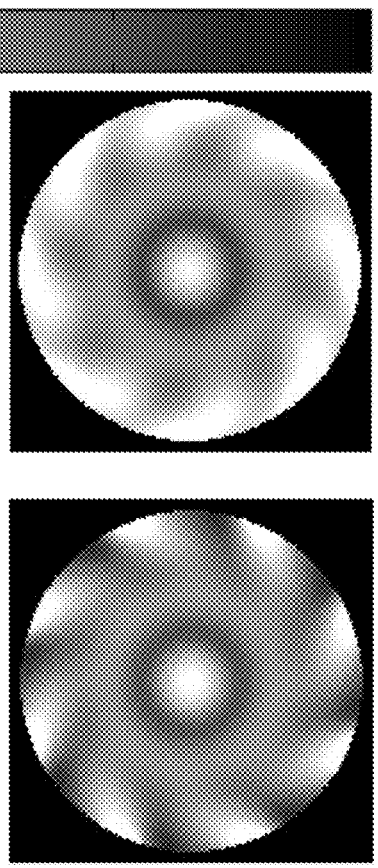
FIG. 13D
FIG. 13E
FIG. 13F
Orientation1
Orientation2
$B_1^+$ (μT / √peak 10g SAR)

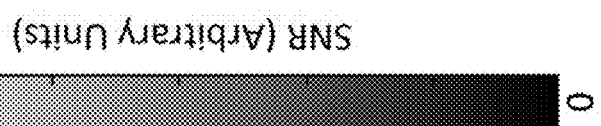
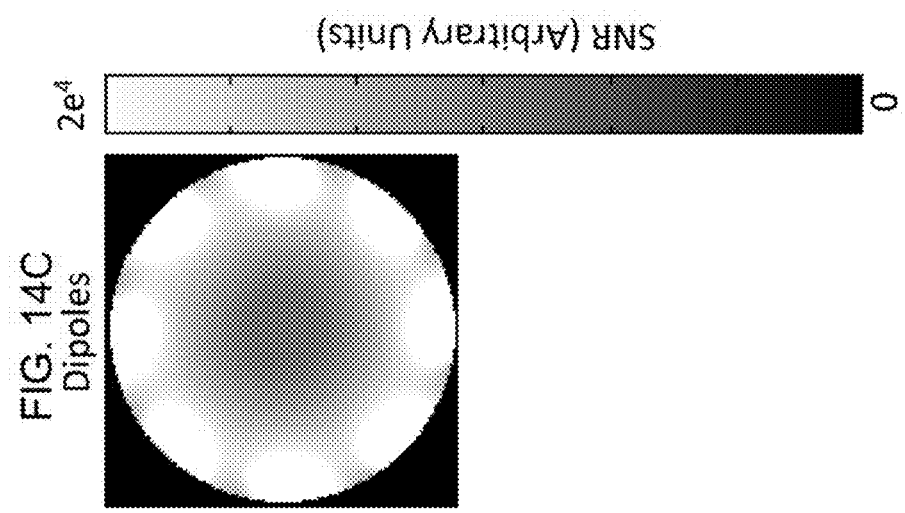
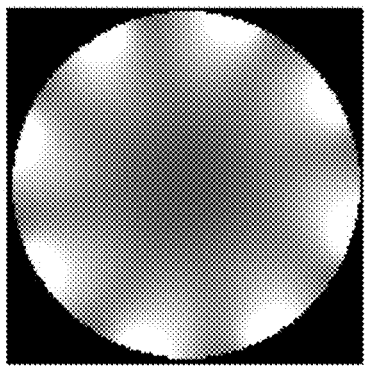
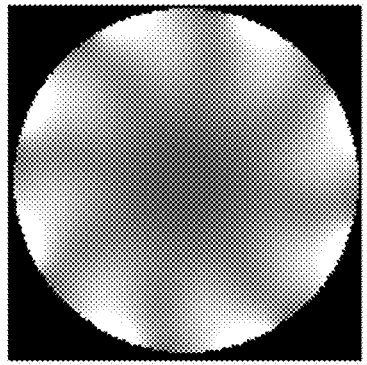
FIG. 14A Balanced / FIG. 14B Unbalanced / FIG. 14C Dipoles / FIG. 14D / FIG. 14E
Orientation1 / Orientation2

$B_1^+$ Maps - Experiments

Balanced

Unbalanced

Dipoles

Orientation1

Orientation2

$B_1^+$ (Flip Angle / V)

90 — 0

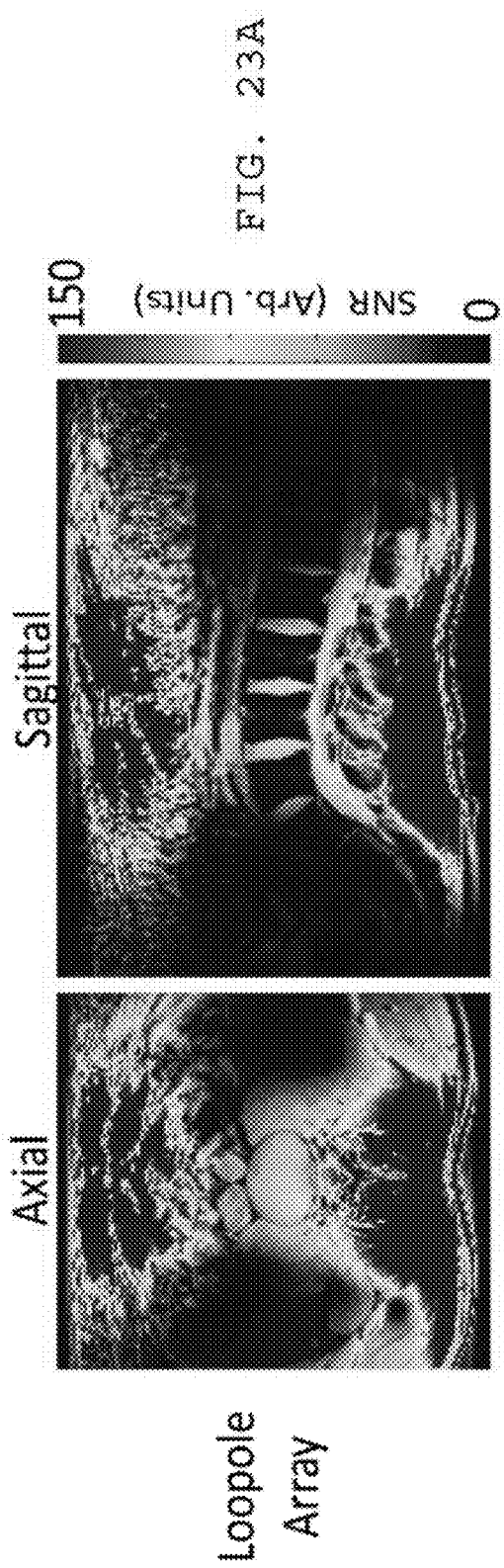
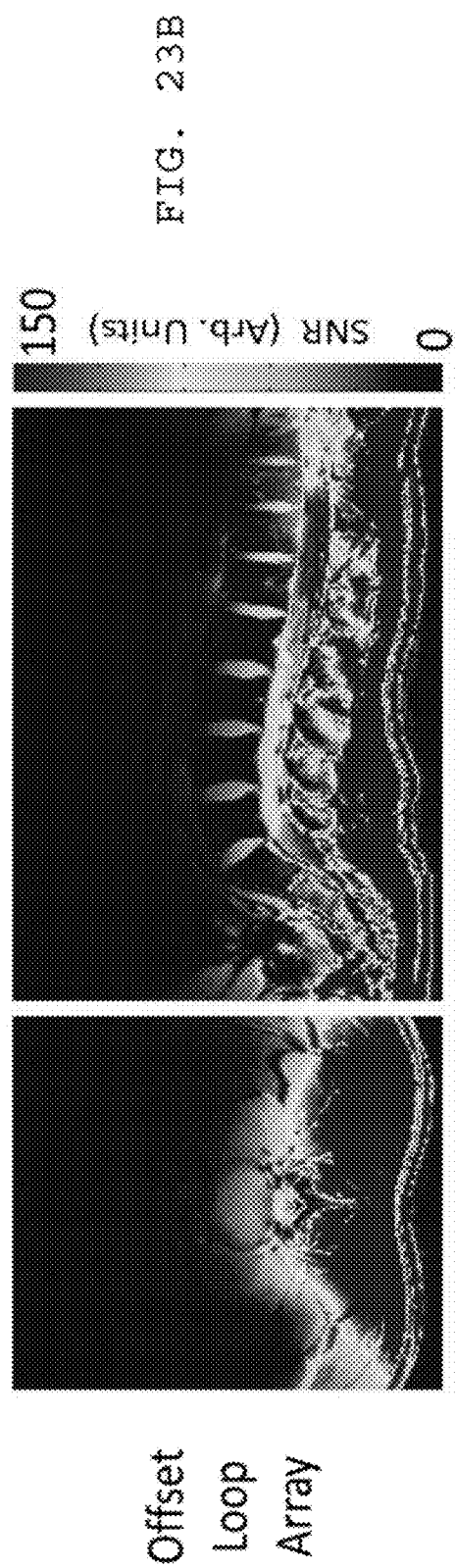
FIG. 23A
FIG. 23B

CIRCULAR DIPOLE AND SURFACE COIL LOOP STRUCTURES AND METHODS FOR USING THE SAME

CROSS-REFERENCE TO RELATED APPLICATION(S)

This application relates to and claims priority from U.S. Patent Application No. 61/904,932, filed on Nov. 15, 2013, the entire disclosure of which is incorporated herein by reference.

FIELD OF THE DISCLOSURE

Exemplary embodiments of the present disclosure relate generally to antenna structures, and specifically to the electromagnetic properties of radio frequency ("RF") antenna structures. Further exemplary embodiments of the present disclosure relate to applications of RF antennas as transmit and receive structures for magnetic resonance imaging ("MRI").

BACKGROUND INFORMATION

Electric dipole fields show an increasing contribution to ultimate intrinsic signal-to-noise ratio ("SNR" or "UISNR") at high fields. (See, e.g., References 11 and 12). Substantial SNR boosts are shown in a body sized phantom at magnetic fields of, for example, 7 Tesla ("7 T"), by using a combination of loop and electric dipole elements. (See, e.g., Reference 13). A mixture of element types can also improve the performance of parallel transmit array designs. (See, e.g., Reference 14). However, as most parallel transmit systems are currently limited to eight channels design options are limited.

At fields of, for example, 7 T and higher, electric dipole antennas can be applied as transmit and receive coils for magnetic resonance ("MR") imaging. (See, e.g., References 1, 2 and 3). There are challenges in applying electric dipole antenna designs for MR imaging. A self-resonant half wavelength dipole antenna for about 300 MHz (e.g., the 7 T operating frequency) can be between, for example, 35 and 50 cm long, depending on its proximity to tissue, which is inconveniently long for many applications. Placing a slab of high dielectric material between the dipole and the body can shorten the length, but such blocks of material are bulky (see e.g., Reference 4), and high specific absorption rate ("SAR") can be generated at the edges of the block. (See, e.g., Reference 4).

The inclusion of lumped element inductors, or meanders, along the length of the dipole antenna can shorten it, but often at the cost of increased losses. Typical measures used to decouple arrays of surface coil loops, such as overlap or decoupling circuitry, may not be applicable to dipole antennas, limiting the density of dipole antenna placement with current designs. To achieve improved performance at 7 T, a combination of magnetic loop and electric dipole elements can be desired (see, e.g., Reference 5 and 13), doubling the number of elements needed to provide sample coverage and diverse antenna properties.

A loop element with a non-uniform current distribution behaves as both a loop antenna and an electric dipole antenna1. At 7 Tesla in a body sized phantom this "loopole" element can achieve either higher central B1+ or higher SNR as compared to a traditional balanced current loop depending on the orientation of the excitation port. (See e.g., References 18 and 19). With increasing current imbalance the loopole performs more like an electric dipole antenna, which has been shown to be favorable for central SNR in body sized objects at 7 T. (See e.g., Reference 20). Nevertheless the loopole coils can still be fabricated like conventional surface coil loops, for example, tuned with trimmer capacitors, decoupled through overlapping and tiled to make dense transceiver arrays. A loopole coil also exhibits reduced loading sensitivity compared to an electric dipole, where proximity to the conductive object results in significant tune and match variation. (See e.g., Reference 21). These properties make the loopole a desirable building block in practical transceiver coil arrays to image centrally located body regions.

Achieving adequate flip angle in the spine at 7 T has been a challenge due to its central location, limited available RF power and SAR constraints. In this work we designed a four element loopole array consisting of an anterior and posterior shell with two overlapped loopole elements in each half for human spine imaging at 7 T. In each pair of elements one is used to transmit and both are used to receive. We performed bench measurements, simulations and MR experiments comparing the proposed design with a variety of previously described 7 T spine arrays. (See e.g., References 22 and 23).

Thus, it may be beneficial to provide exemplary circular dipole and surface coil loop structures, which can overcome at least some of the deficiencies described herein above.

SUMMARY OF EXEMPLARY EMBODIMENTS

Exemplary embodiments of the present disclosure can include an antenna arrangement, which can include a substantially circular conductor(s) having a feed point provided on a first side and a gap on a second side, where the second side can be provided opposite to the first side. The substantially circular conductor(s) can be configured to generate unbalanced current flow when excited by a radio frequency. The arrangement can have a substantially planar configuration. The substantially circular conductor(s) can be a substantially flat conductor strip formed into a circle. The substantially flat conductor strip can have a width of about 5 cm, and the substantially circular conductor(s) can have an inner diameter of about 16 cm.

In some exemplary embodiments of the present disclosure, a drive port electromagnetically can be coupled to the substantially circular conductor(s) at the gap. A capacitor(s) can be coupled to the drive port. The gap can have a width of about 5 mm or about 2 cm. The substantially circular conductor(s) can cause the arrangement to resonate at a frequency of about 297.2 MHz. The substantially circular conductor(s) can be formed from a substantially linear dipole structure. The substantially circular conductor(s) can include a plurality of substantially circular conductors spaced apart from one another, which can be overlapped by about 2 cm.

Another exemplary embodiment of the present disclosure can include an antenna arrangement, which can include a surface coil loop conductor(s) and a plurality of capacitors coupled to the surface coil loop conductor(s), the capacitors being configured to facilitate a first magnitude of current flow on a first side of the surface coil loop conductor(s) which can be larger than a second magnitude of current flow on a second side of the e surface coil loop conductor(s), the second side being opposite to the first side.

A further exemplary embodiment of the present disclosure can include an antenna arrangement, which can include a surface coil loop conductor(s) and a plurality of capacitors coupled to the surface coil loop conductor(s), the capacitors being configured to facilitate an unbalanced current flow when the surface coil loop conductor(s) can be excited by a radio frequency (RF). The surface coil loop conductor(s) and the plurality of capacitors are configured to cause a transmission of an electromagnetic radiation from the MRI apparatus to a body. The surface coil loop conductor(s) and the capacitors can be configured to receive a resultant electromagnetic radiation from the body that can be based on the electromagnetic radiation, and provide the resultant electromagnetic radiation to the MRI apparatus to facilitate imaging of the body.

In certain exemplary embodiments of the present disclosure, a transmit coil(s) and a receive coil(s) can be provided each of which can be configured to interact with the MRI apparatus. The surface coil loop conductor(s) can include a plurality of surface coil loop conductors overlapping one another. In some exemplary embodiments of the present disclosure, the surface coil loop conductors can include 8 surface coil loop conductors. A plurality of capacitors can be coupled to the surface coil loop conductor(s) in a long feed leg, on an opposite long leg, in one short leg, or in two short legs. The capacitors can each have a different capacitance. The capacitor values can be chosen such that current flows on the surface coil loop unevenly, with higher current on the long feed leg compared to the opposite long leg.

An even further exemplary embodiment of the present disclosure can include a computer-accessible medium for generating an image, which can include, for example, receiving magnetic resonance imaging (MRI) information from an antenna arrangement electromagnetically coupled to a MRI apparatus. The antenna arrangement can include, for example, a substantially circular conductor(s) having a feed point on a first side and a gap on a second side, the second side provided opposite to the first side.

These and other objects, features and advantages of the present disclosure will become apparent upon reading the following detailed description of exemplary embodiments of the present disclosure, when taken in conjunction with the accompanying exemplary drawings and appended claims.

BRIEF DESCRIPTION OF THE DRAWINGS

The foregoing and other objects of the present disclosure will be apparent upon consideration of the following detailed description, taken in conjunction with the accompanying exemplary drawings and claims showing illustrative embodiments of the present disclosure, in which:

FIG. 1A is an illustration of an exemplary circular dipole structure according to an exemplary embodiment of the present disclosure;

FIG. 1B is an illustration of a linear or straight dipole structure;

FIG. 4A is an illustration of an exemplary axial map of the amount of circular polarization for the exemplary circular dipole according to an exemplary embodiment of the present disclosure;

FIG. 4B is an illustration of an axial map of the amount of circular polarization for the straight dipole;

FIG. 5A is an illustration of an exemplary sagittal map of the amount of circular polarization for the exemplary circular dipole according to an exemplary embodiment of the present disclosure;

FIG. 5B is an illustration of a sagittal map of the amount of circular polarization for the straight dipole;

FIG. 9A is an illustration of an exemplary array layout according to an exemplary embodiment of the present disclosure;

FIG. 9B is an illustration of an exemplary array layout showing that the capacitors can be unevenly distributed according to an exemplary embodiment of the present disclosure;

FIG. 11A is a simulated map of current density in a phantom for a single-balanced loop;

FIG. 11B is a simulated map of current density in a phantom for an unbalanced loop according to an exemplary embodiment of the present disclosure;

FIG. 12A is a simulated $B_1^+$ field map for the single-balanced loop;

FIG. 12B is an exemplary simulated $B_1^+$ field map for an unbalanced loop according to an exemplary embodiment of the present disclosure;

FIG. 12C is a simulated $B_1^+$ field map for an electric dipole;

FIG. 12D is an experimental $B_1^+$ field map for the single-balanced loop;

FIG. 12E is an exemplary experimental $B_1^+$ field map for the unbalanced loop according to an exemplary embodiment of the present disclosure;

FIG. 12F is an experimental $B_1^+$ field map for the electric dipole;

FIG. 13A is a simulated $B_1^+$ field map for the balanced array in a first orientation;

FIG. 13B is an exemplary simulated $B_1^+$ field map for the unbalanced array in the first orientation according to an exemplary embodiment of the present disclosure;

FIG. 13C is a simulated $B_1^+$ field map for the electric dipole in the first orientation;

FIG. 13D is a simulated $B_1^+$ field map for the balanced array in a second orientation;

FIG. 13E is an exemplary simulated $B_1^+$ field map for the unbalanced array in the second orientation according to an exemplary embodiment of the present disclosure;

FIG. 13F is a simulated $B_1^+$ field map for the electric dipole in the second orientation;

FIG. 14A is an SNR map for the balanced array in the first orientation;

FIG. 14B is an exemplary SNR map for the unbalanced array in the first orientation according to an exemplary embodiment of the present disclosure;

FIG. 14C is an SNR map for the electric dipole in the first orientation;

FIG. 14D is an SNR map for the balanced array in the second orientation;

FIG. 14E is an exemplary SNR map for the unbalanced array in the second orientation according to an exemplary embodiment of the present disclosure;

FIG. 23A is a set of in-vivo SNR maps for the exemplary loopole array according to an exemplary embodiment of the present disclosure;

FIG. 23B is a set of in-vivo SNR maps for the exemplary offset loop array according to an exemplary embodiment of the present disclosure;

Figure 2A:
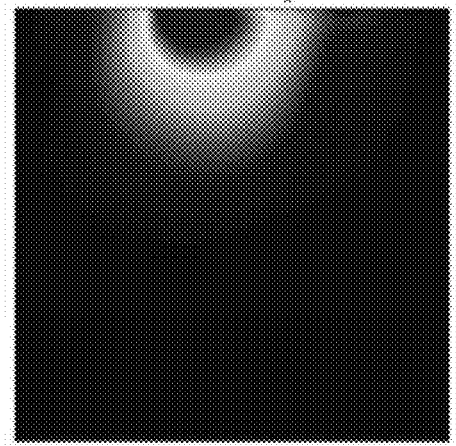
FIG. 2A is an exemplary simulated $B_1^+$ field map for a central axial slice of a circular dipole according to an exemplary embodiment of the present disclosure.

Throughout the drawings, the same reference numerals and characters, unless otherwise stated, are used to denote like features, elements, components or portions of the illustrated embodiments. Moreover, while the present disclosure will now be described in detail with reference to the figures, it is done so in connection with the illustrative embodiments and is not limited by the particular embodiments illustrated in the figures or provided in the appended claims.

DETAILED DESCRIPTION OF EXEMPLARY EMBODIMENTS

In MR imaging, $B_1^+$ and $B_1^-$ can be defined as components of the RF magnetic field, which can rotate and anti-rotate in a plane perpendicular to the static magnetic field. With the static field defined along the z axis, for example, $B_1^+ = B_x + iB_y$, and $B_1^- = B_x - iB_y$. In an efficient system, the ratio $|B_1^+|/|B_1^-|$ can exceed one.

Exemplary Circular Dipole

A circular dipole is described herein, and can include a circular conductor with a feed point on one side, and a gap on the other. (See e.g., FIG. 1). This exemplary antenna design can have benefits compared to a straight half-wavelength self-resonant dipole antenna including $B_1^+$ efficiency, compactness, decoupling of neighboring elements and the potential for capturing magnetic and electric dipole fields in a single element.

Exemplary Methods

Exemplary embodiments of applications of RF antennas as transmit and receive structures for magnetic resonance imaging, and circular dipole and surface coil loop structures can be provided. According to an exemplary embodiment of the present disclosure, a configuration of array element(s) can be provided which can capture magnetic and electric dipole fields in a single antenna structure, and demonstrate improved performance compared to conventional surface coil loops at 7 T.

In various examples and exemplary embodiments of the present disclosure, circular loop and "loophole" antennas can be utilized to improve RF coil performance, for example, in an MRI imaging system configured to encompass both loop and electric dipole behavior in a single antenna element. This can increase the performance of each single antenna element or structure, providing robust mixed loop and dipole performance while reducing (e.g., halving) the number of such elements, as compared to other systems.

In "loopole" (e.g., loop+dipole) or unbalanced loop exemplary embodiments, an RF antenna for a medical imaging system can be provided as a surface coil loop with capacitors arranged so that current can flow preferentially on one side of the loop, as compared to the other (e.g., opposite) side of the loop. The current imbalance can be adjusted to select or "dial in" desired amounts or degrees of loop and dipole behavior.

In circular loop exemplary embodiments, an RF antenna for a medical imaging system can be provided in the form of a dipole wrapped around into a circle. Unlike loopole embodiments, in some configurations the circular loop embodiments do not need to have capacitors distributed along their length, and a gap can be provided at the far side of the coil from the feeding point. Alternatively or in addition, capacitors can be provided. Thus, the exemplary circular loop can be used as an extension of the loopole exemplary design.

Full wave electromagnetic simulations were performed with a finite-difference time domain ("FDTD") method, for example, utilizing a Microwave Studio, CST, 2012 MA system. The coil was modeled as a flat conductor strip, at about 5 cm wide, forming a circle with inner diameter, 165 of about 16 cm. (See e.g., FIG. 1A). A drive port 110 was placed at gap in the conductor of about 5 mm. With a gap in the far side of the circle, of about 2 cm, the antenna was resonant at a radio frequency, for example, at about 297.2 MHz. This structure was placed above a rectangular block of material, for example, about 2 cm above an about 40 cm×25 cm×80 cm block of material with $\epsilon_r$ about equal to 59 and σ about equal to 0.77.

An $S_{11}$ match of about −20 dB was achieved by placing a capacitor (e.g., about 6.8 pF) in parallel with the drive port. A straight dipole antenna (see, e.g., FIG. 1B) was also simulated, for example, at about 40 cm long with a conductor width of about 5 cm on the same phantom. In this example, a match of about −16 dB was achieved by placing a capacitor in parallel with the drive port of about 3.9 pF. The simulated SNR was calculated by using the Kellman method. (See, e.g., Reference 6).

Exemplary Results

Figure 2B:
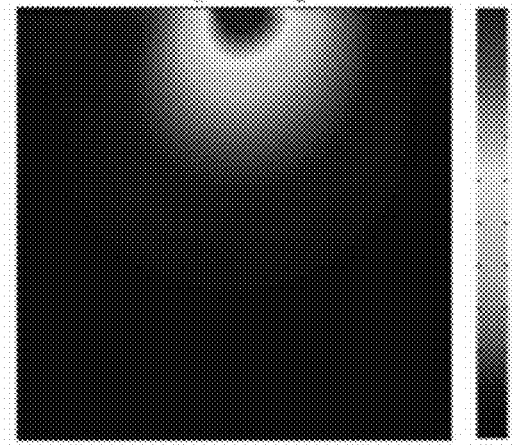
FIG. 2B is a simulated $B_1^+$ field map for a central axial slice of a straight dipole.
Figure 3A:
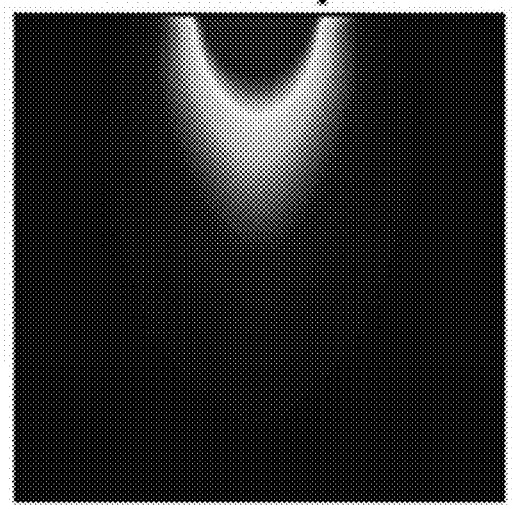
FIG. 3A is a simulated $B_1^+$ field map for a sagittal slice of the exemplary circular dipole according to an exemplary embodiment of the present disclosure.
Figure 3B:
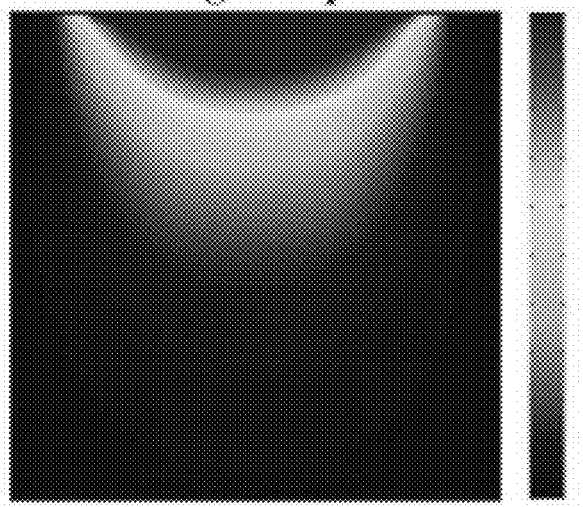
FIG. 3B is a simulated $B_1^+$ field map for a sagittal slice of the straight dipole.

Simulated $B_1^+$ maps for the circular and straight dipole antennas are shown in FIGS. 2A and 2B. The circular dipole (see, e.g., FIG. 2A) can create greater excitation near the coil, while still having lower $B_1^+$ at depth compared to the straight dipole. (See, e.g., FIG. 2B). The peak 10 g averaged SAR was higher for the circular dipole (e.g., about 0.7247 as compared to about 0.4874 for the straight dipole), but when $B_1^+$ can be normalized by dividing by the square root of peak SAR, the resulting $B_1^+$ maps still show better performance near the circular dipole (see, e.g., FIG. 3A). As shown in FIGS. 3A and 3B, the exemplary sagittal slice also shows the reduced z-extent of the excitation created by the circular dipole (see, e.g., FIG. 3A) compared to the straight dipole. (See, e.g., FIG. 3B).

An exemplary examination of the B-vector evolution with time in the simulation illustrates that there can be regions near the circular dipole where circular polarization can be produced, whereas the excitation can be almost completely linear for the straight dipole. This exemplary behavior is shown in FIGS. 5A & 5B, which illustrates a degree of correct circular polarization by plotting $(|B_1^+|/|B_1^-|)^2$. A value of 2 can represent a field B1, which can be completely circularly polarized in the "correct" sense. A value of 1 can represent linear polarization, and a value of 0 can represent anti-quadrature polarization. A substantial amount of circular polarization can be produced by the circular dipole (element 605), as compared to almost none for the straight dipole (element 610). This can be due to the loop-like structure of the circular dipole and the eddy currents induced in the sample. (See, e.g., Reference 7).

FIG. 4A illustrates an axial map of the amount of circular polarization produced by the exemplary circular dipole arrangement. Underneath the drive point, where the $B_1^+$ field can be strong, there can also be a lot of circular polarization, which can increase the efficiency of the exemplary antenna arrangement. FIG. 4B illustrates an axial map of the amount of circular polarization produced by the straight dipole. Near the antenna where the $B_1^+$ field can be strong there is only linear polarization, making this antenna less efficient. FIG. 5A illustrates a sagittal map of the amount of circular polarization produced by the exemplary circular dipole arrangement. FIG. 5B illustrates a sagittal map of the amount of circular polarization produced by the straight dipole. Directly under each antenna where the $B_1^+$ field can be strong the exemplary circular dipole produces more circular polarization than the straight dipole.

Figure 6:
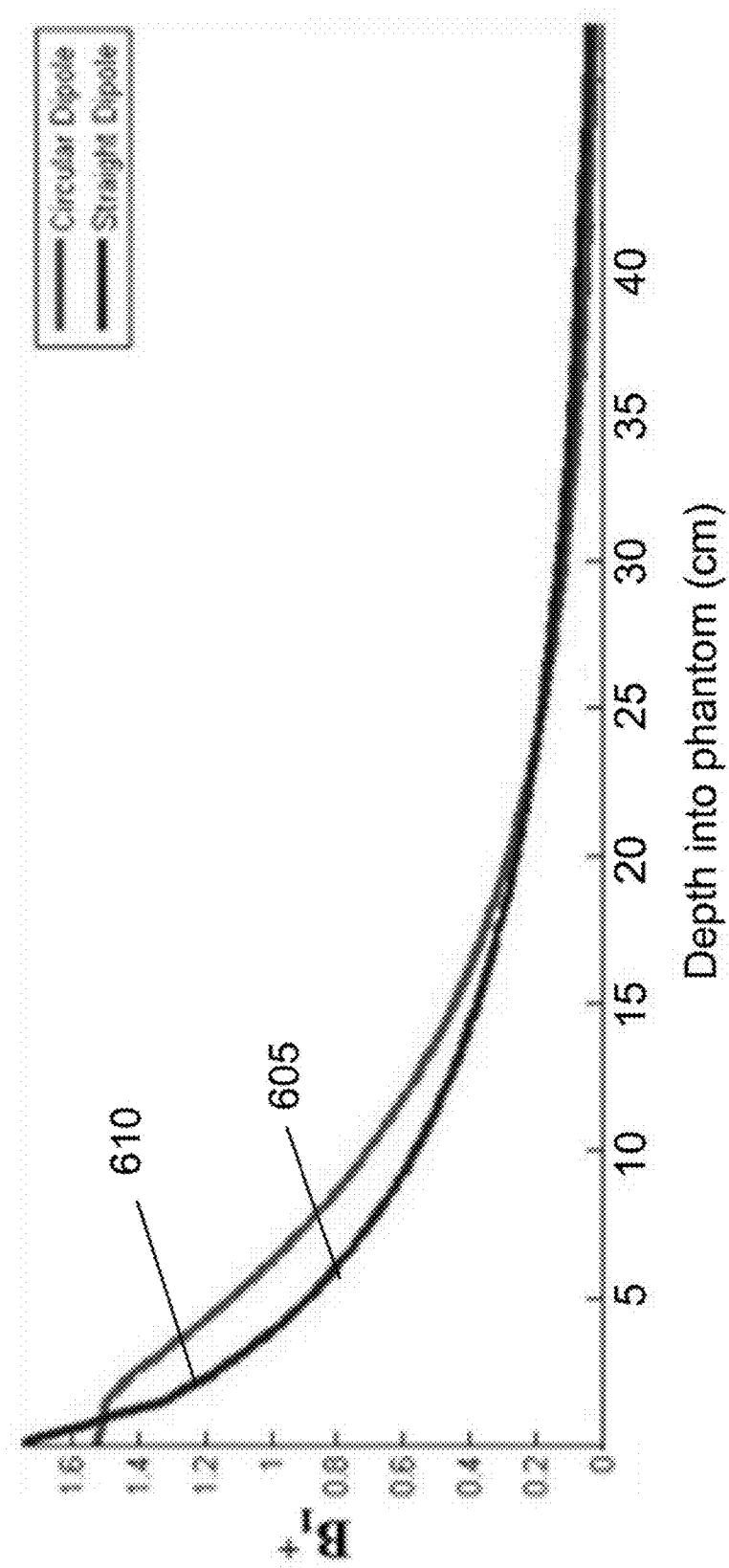
FIG. 6 is a graph of $B_1^+$ field strength as function of phantom depth for circular and straight dipole structures according to an exemplary embodiment of the circular dipole structure, as described in the present disclosure.

The exemplary $B_1^+$ profiles of the circular and straight dipoles along the phantom depth are shown in FIG. 6. The profiles show that a circular dipole can produce higher $B_1^+$ at particular depths, for example, between about 5 cm and about 10 cm. At other exemplary depths, for example, between about 10 cm and about 15 cm, the circular dipole and the straight dipole can produce similar $B_1^+$. In some examples, the straight dipole (see, e.g., FIG. 4B) can be better at other depths, for example, beyond about 15 cm.

Figure 7A:
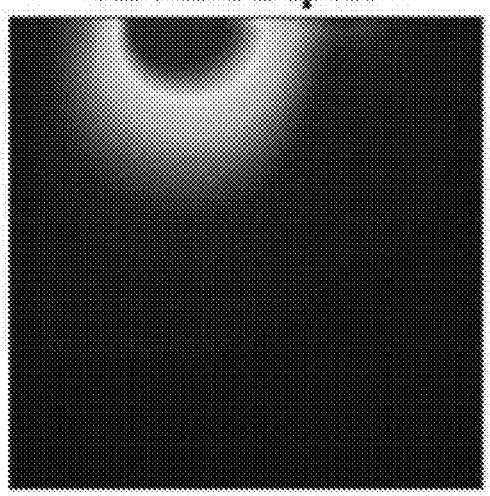
FIG. 7A is an exemplary simulated signal-to-noise ratio ("SNR") map for a central axial slice of an exemplary circular dipole according to an exemplary embodiment of the present disclosure.
Figure 7B:
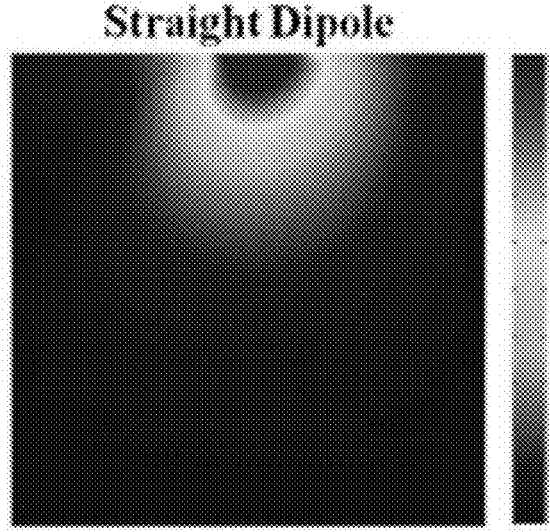
FIG. 7B is a simulated SNR ratio map for a central axial slice of the straight dipole.

Exemplary simulated SNR maps are shown in FIGS. 7A and 7B. For example, at shallow depths, (e.g., about 5-10 cm), the circular dipoles show better SNR performance (see, e.g., FIG. 7A). This can be due to the fact that the circular dipoles can be sensitive to both magnetic and electric dipole fields. At other depths, for example, between about 10 cm and about 15 cm, the exemplary SNR performance can be almost similar, and the straight dipole can start to win out after certain depths (e.g., about 15 cm). (See, e.g., FIG. 7A).

Exemplary Discussion

Figure 8:
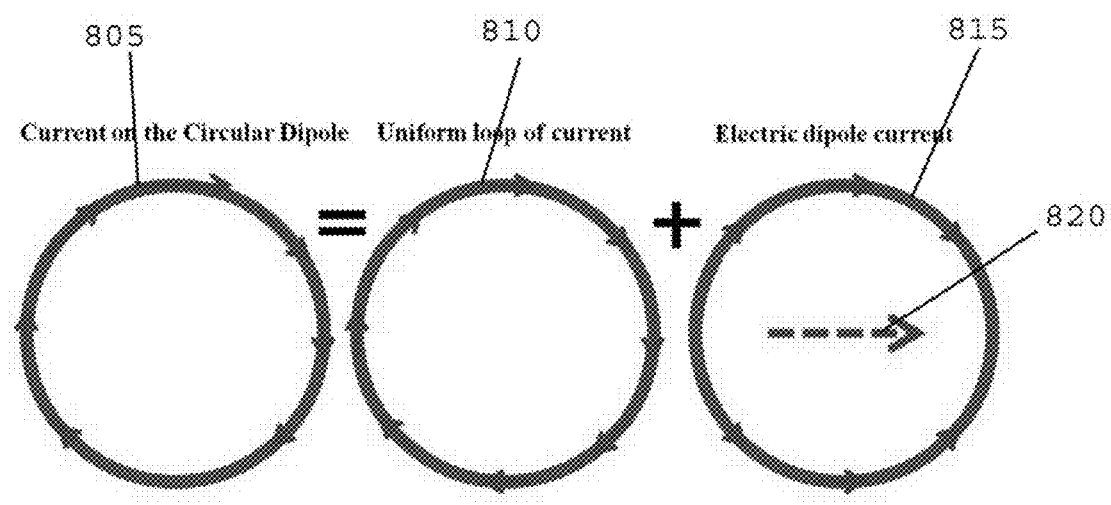
FIG. 8 is a diagram illustrating current distribution on an exemplary circular dipole according to an exemplary embodiment of the present disclosure.

The exemplary circular polarization created by the circular dipole, according to an exemplary embodiment of the present disclosure, can indicate that can should be sensitive both to electric and magnetic dipole fields, offering better performance than either a traditional loop or straight dipole alone. This can be supported by considering the current distribution on the circular dipole as shown in FIG. 8, where the current on the circular dipole 805 can be approximately or exactly equal to the uniform loop of the current 810 plus the electric dipole current 815.

This can be considered as a linear superposition of a uniform loop of current and a pattern with current traveling in opposite directions around the loop on opposite sides. Such latter current exemplary pattern can have a net electric dipole moment, indicated by the dotted arrow 820. This has been demonstrated analytically for loop antennas with non-uniform current. (See, e.g., Reference 8). It can be possible to demonstrate enhanced performance due to the sensitivity to magnetic and electric dipole fields. It can also be possible to, for example, place circular dipoles in close proximity to each other (e.g., spaced with an overlap of about 2 cm for about 16 cm diameter elements), in an arrangement similar to overlapped loop coils. This can provide for the tiling of a surface with a large number of circular dipoles to reap the advantages of highly parallel coil arrays.

Exemplary Loopole Examples

An exemplary circular surface coil with uniform current can be substantially equivalent to a magnetic dipole. However, if the current is not uniform, the field created by the surface coil can be de-convolved into a magnetic dipole and an electric dipole component. (See, e.g., Reference 8). It can be beneficial in an RF coil design to try to maintain a uniform current distribution in a surface coil, using an appropriate amount of distributed capacitance. According to an exemplary embodiment of the present disclosure, in contrast to the conventional designs, surface coil loops can be provided with a highly non-uniform current distribution in order to capture both magnetic and electric dipole fields in a single structure, which can be referred to here as a "loopole." Through appropriate choice of capacitors in the loop, current can be concentrated near the drive point for controlling the degree of current asymmetry.

Further Exemplary Methods

Full wave electromagnetic simulations were performed with the FDTD method (e.g., using CST Microwave Studio). A cylindrical phantom 905 was modeled, for example, with $\epsilon_r$ of about 81.81, σ of about 0.604, about 29.5 cm in diameter and about 1.4 m long. Overlapped rectangular coils 910 (e.g., eight) with capacitors 915 (e.g., twelve) each were modeled on a cylindrical surface, for example with diameter of about 31.5 cm about 20 cm along the z direction and about 16 cm wide. (See e.g., FIG. 9).

In an exemplary embodiment of the exemplary array arrangement, all capacitors 920 in the balanced coil can about the same (e.g., about 6.8 pF). As shown in FIG. 9B, the unbalanced elements can have capacitors 920 (e.g., two capacitors) in the long feed leg and can be about 10 pF. Capacitors 925 (e.g., three capacitors) can be positioned in the opposite long leg and can be about 1.5 pF. Capacitors 930 (e.g., three capacitors) can be positioned in each of the short legs, and can be about 6.8 pF. The exemplary coils can be tuned, matched and driven, for example with about 50 ohm ports in simulation.

Figure 10:
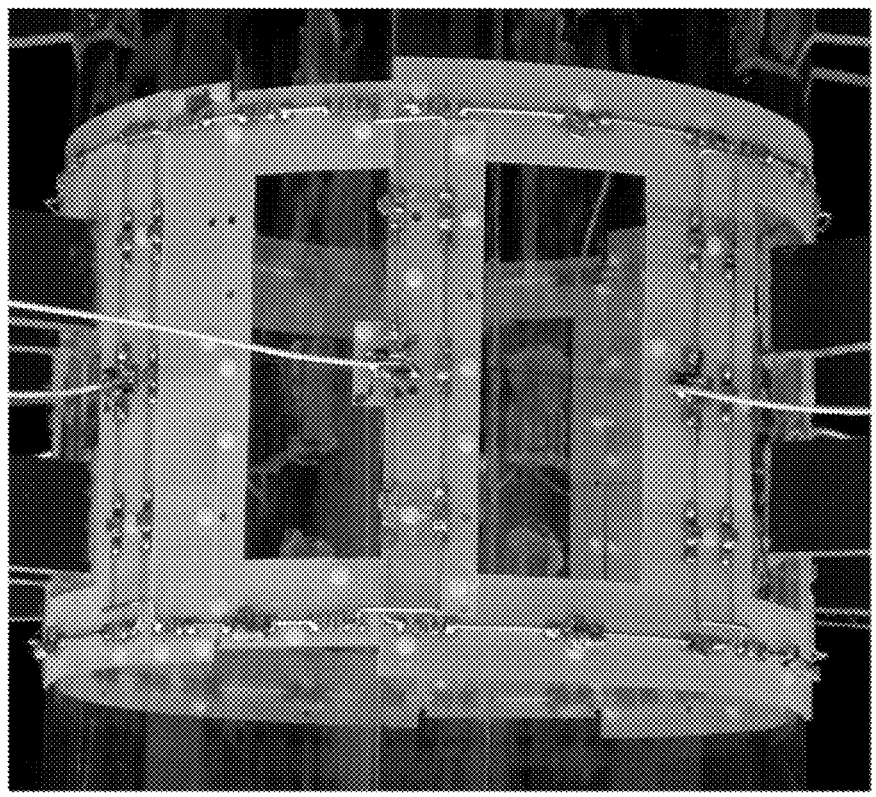
FIG. 10 is a perspective view of an exemplary coil constructed according to an exemplary embodiment of the present disclosure, used in a medical imaging apparatus.
Figure 15A:
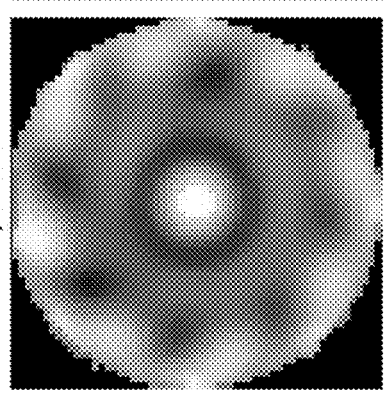
FIG. 15A is an experimental $B_1^+$ field map for the balanced array in the first orientation.
Figure 15B:
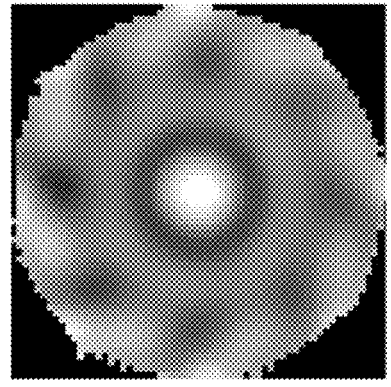
FIG. 15B is an exemplary experimental $B_1^+$ field map for the unbalanced array in the first orientation according to an exemplary embodiment of the present disclosure.
Figure 15C:
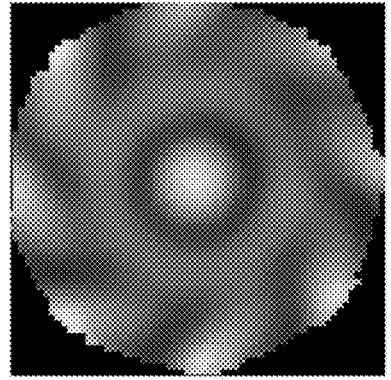
FIG. 15C is an experimental $B_1^+$ field map for an electric dipole in the first orientation.
Figure 15D:
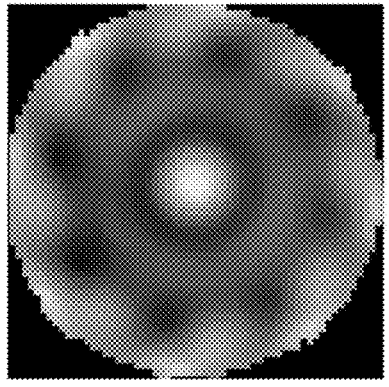
FIG. 15D is an experimental $B_1^+$ field map for the balanced array in the second orientation.
Figure 15E:
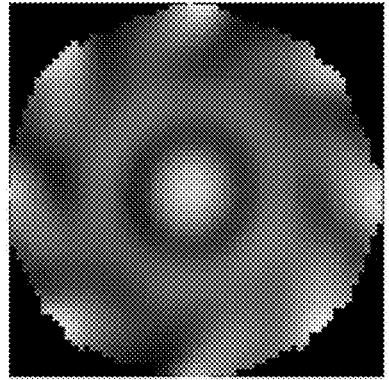
FIG. 15E is an exemplary experimental $B_1^+$ field map for the unbalanced array in the second orientation according to an exemplary embodiment of the present disclosure.

For experimental verification, two arrays (e.g., eight channel arrays) were constructed with substantially identical dimensions and capacitance values as in the simulation. (See e.g., FIG. 10). The balanced array was driven at the service end to maintain the current balance, and the unbalanced array was driven at the side to enhance the current unbalance. Quarter wavelength (λ/4) lattice baluns were used to match the coil arrays to coaxial cables.

The constructed arrays were used in transmit receive mode on a 7 T scanner with eight channel parallel transmit (e.g., as available from Siemens of Erlangen Germany). Transmit phases were chosen to align all phases at the center of the phantom. Excitation was calibrated at the center of the phantom using a turbo flash scan with preparation pulse. (See, e.g., Reference 15). Field ($B_1^+$) maps were obtained, for example with the actual flip angle imagine ("AFI") method (see, e.g., Reference 16) and individual coil $B_1^+$ maps were obtained using a low flip angle GRE. The SNR was calculated using the Kellman method (see, e.g., Reference 1 and 6) from gradient-recalled echo ("GRE") acquisitions, both with and without RF excitation (e.g., with TR/TE/Flip/BW of about 2000 ms/3.6 ms/90°/300 Hz per pixel, respectively, Matrix=64, FoV of about 320 mm, Slice or about 5 mm).

Exemplary Results and Simulations

The CST simulations achieved better than about −25 dB of match and at worst an isolation of about −14 dB for the balanced and the unbalanced loops. Due to the difficult nature of this analysis, there can be inconsistencies in the display of surface currents in the simulation software.

A graph of the exemplary current density in the phantom is shown in FIGS. 11A and 11B, to illustrate the current unbalance, which was about 3.4:1 for the unbalanced loops (see, e.g., FIG. 11B). Exemplary RF magnetic field ($B_1^+$) maps for a single balanced loop, unbalanced loop and an electric dipole element are shown in FIGS. 12A-12F. In this example, the electric dipole element was about 36 cm long in Z. The balanced loop exhibits an asymmetric $B_1^+$ with a strong null, whereas the electric dipole exhibits nearly symmetric $B_1^+$. The unbalanced loop shows hybrid behavior, with excitation focused near the stronger current side, but with a small side lobe and weak null.

Simulated $B_1^+$ and SNR maps for the eight channel balanced and unbalanced arrays are shown in FIGS. 13A-13F, 14A-14F, respectively. The $B_1^+$ (see, e.g., FIGS. 13A and 13F) and SNR (see, e.g., FIGS. 14A-14F) maps were generated in two orientations, where in orientation No. 2 the coil was flipped end to end with respect to orientation No. 1. The balanced loop array and electric dipole array showed almost the same $B_1^+$ and SNR between orientations. However, the unbalanced array showed a more optimal $B_1^+$ in orientation No. 1 but with low SNR, whereas it had less than optimal $B_1^+$ and the highest SNR in orientation No. 2.

This asymmetry can be expected, given the configuration of the ideal current patterns. (See, e.g., Reference 3). The best unbalanced loop $B_1^+$ was about 18% better than for the balanced loops and about 10% better than for the dipole array, while the best unbalanced loop SNR was better by about 22% and about 13%, respectively.

Exemplary Experiments

The unloaded and loaded Q values for the constructed balanced and unbalanced elements were about 80 and about 6, and about 55 and about 6, respectively, with Q ratios of about 13 and about 9, indicating sample noise dominance. All elements were matched to better than about −20 dB with isolation between elements better than about −15 dB.

Experimentally acquired exemplary $B_1^+$ maps for the three arrays are shown in FIGS. 15A-15E. There can be a small deviation between the $B_1^+$ values for the balanced array between the two orientations, but there can still be an increase in central $B_1^+$ with the unbalanced array in orientation No. 1, which was about 35% higher than the average balanced array value. The overall $B_1^+$ distributions can be very similar to simulation, with improved uniformity for the unbalanced array in the first orientation. Exemplary central SNR values are shown in FIG. 16, which illustrates a small dependence on orientation for the balanced array, but SNR boost of about 37% for the unbalanced array compared to the average balanced SNR value.

Figure 16:
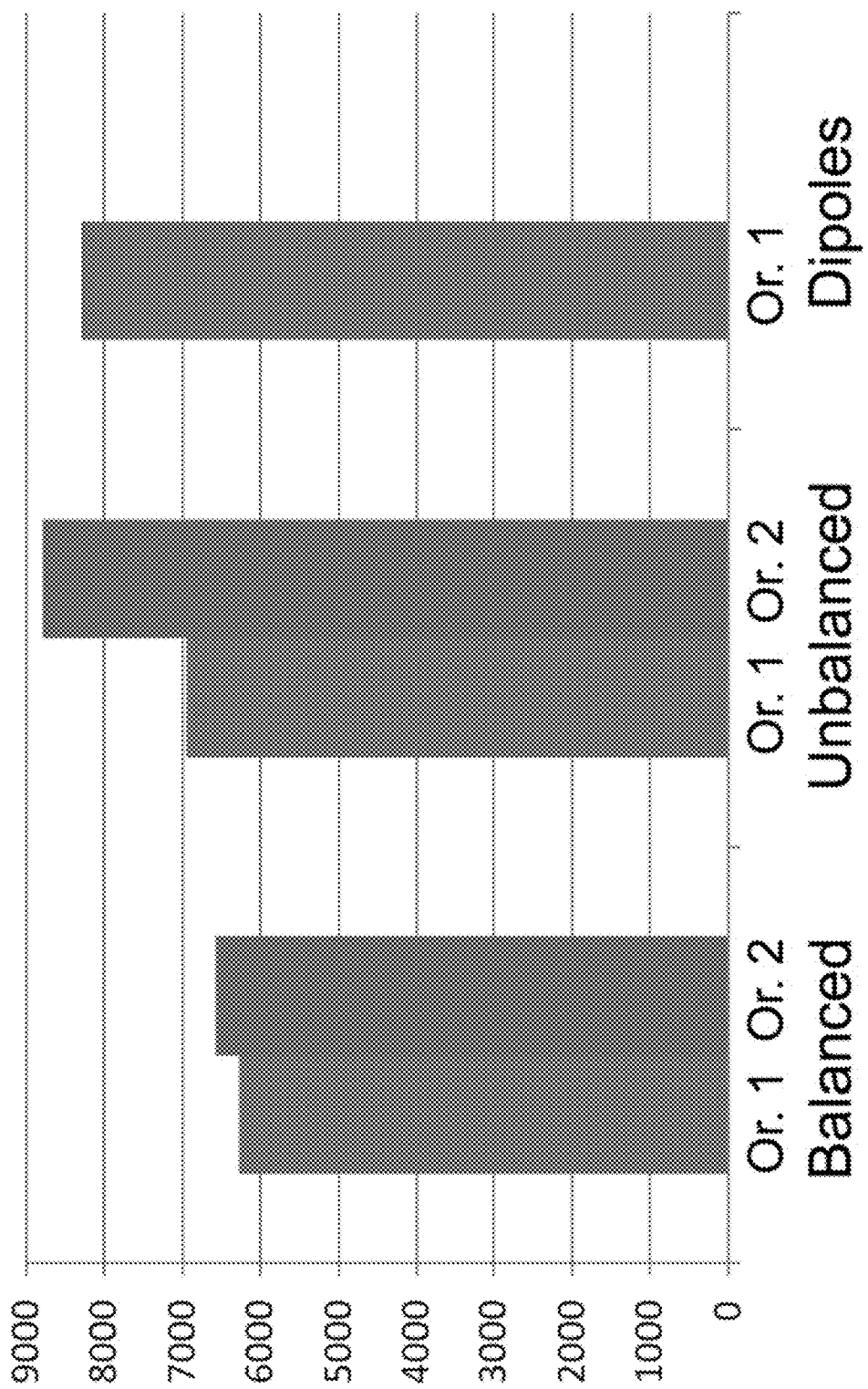
FIG. 16 is an experimental bar graph of central SNR values for balanced and unbalanced arrays in the first and second orientations and for the dipole in the first orientation, according to exemplary embodiments of the unbalanced array as described in the present disclosure.

FIG. 16 is a graph illustrating experimental SNR values, which show that the balanced looped and the dipole array have little variation in SNR values based on orientation. However, the unbalanced array in orientation 2 produced the highest SNR of all exemplary cases.

Exemplary Applications

Figure 19:
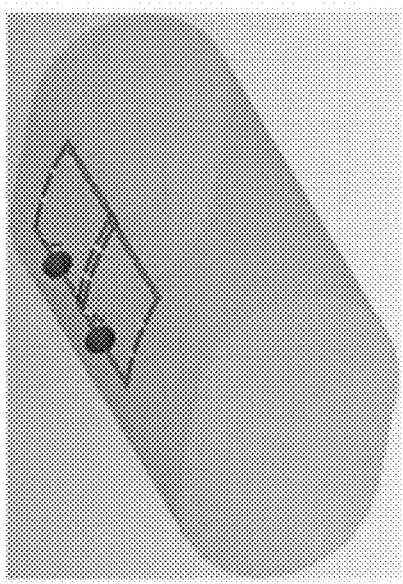
FIG. 19 is an illustration of an exemplary extended z loopole array according to an exemplary embodiment of the present disclosure.
Figure 18:
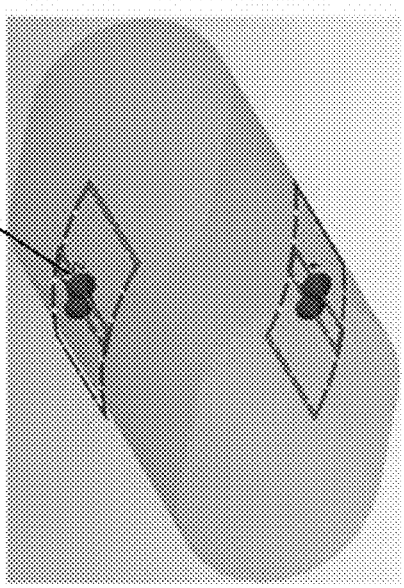
FIG. 18 is an illustration of an exemplary loopole array according to an exemplary embodiment of the present disclosure.

Full wave electromagnetic simulations were performed with the exemplary FDTD method (e.g., CST Microwave Studio). An elliptical phantom was modeled with εr=40.5, σ=0.58 S/m, about 50 cm long, about 29 cm wide and about 19 cm high. Four loopole array elements about 15 cm along z and about 10 cm wide with about 10 capacitors each were modeled on a curved surface. (See e.g., FIG. 18). Each element 1805 had three approximately 18 pF capacitors in the long feed leg, three approximately 3 pF capacitors in the opposite leg and two approximately 15 pF capacitors in each of the short legs. For comparison an offset loop of a known array for spine imaging (see e.g., References 22 and 24), and a known dipole spine array design (see e.g., Reference 23) were modeled and simulated. The offset loop array consisted of three overlapped approximately 15×10 cm rectangular loops in which the center loop and one side loop were used for transmit with an about 90 degree transmit phase. The exemplary dipole spine array consisted of two dipoles approximately 37 cm along z separated by about 6 cm driven with optimal phase for a central excitation. To ensure that the exemplary loopole design could provide an adequate z field of view, a two element loopole array with elements overlapped in z direction (see e.g., FIG. 19) was also simulated. All elements were excited with 50'Ω ports in simulation.

Figure 20:
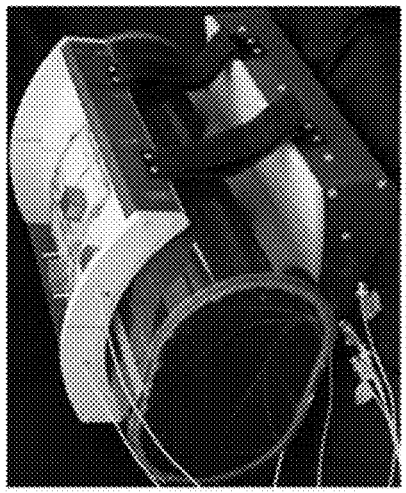
FIG. 20 is an image of the exemplary loopole array according to an exemplary embodiment of the present disclosure.
Figures 21A, 21B:
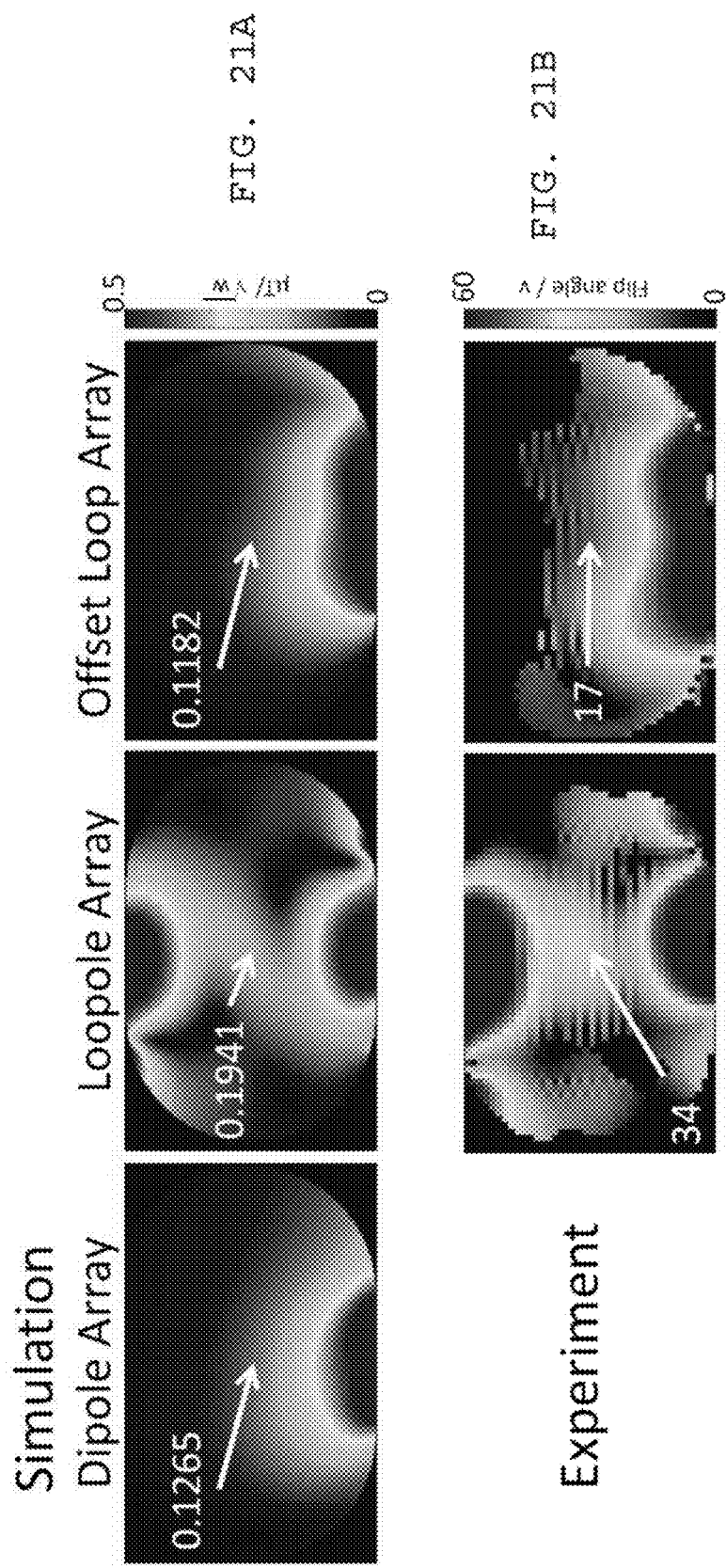
FIG. 21A is a set of simulated axial $B_1^+$ maps according to an exemplary embodiment of the present disclosure.
FIG. 21B is a set of experimental $B_1^+$ maps according to an exemplary embodiment of the present disclosure.
Figure 22:
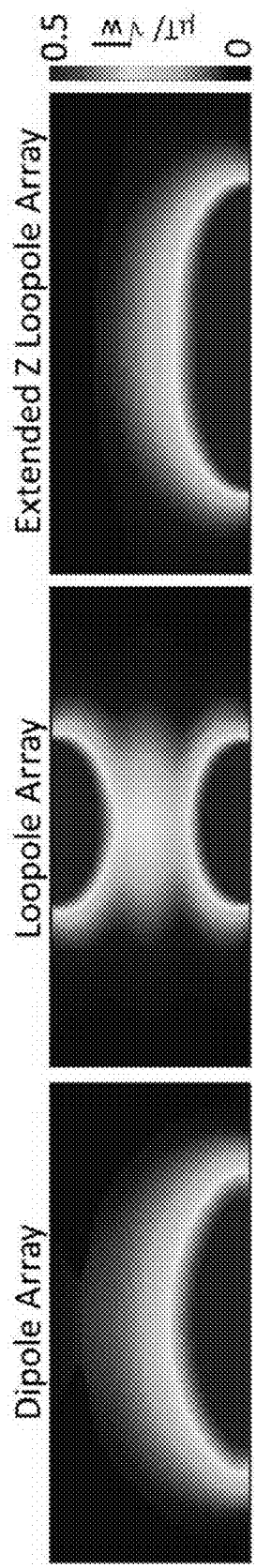
FIG. 22 is a set of sagittal $B_1^+$ maps according to an exemplary embodiment of the present disclosure.

For experimental verification, a four element loopole array was constructed to match the simulated model. (See e.g., FIG. 20). A custom built interface was used to excite the loopole array on a 7 T scanner (e.g., Siemens, Erlangen Germany). The loopole array was compared against a custom built spine array based on offset loop design. (See e.g., Reference 24). Transmit phases were chosen to align all phases at the center of the phantom. A series of GRE images with TR=2000 ms, and different RF pulse voltages were acquired. A sine curve was fitted to the pixel intensities to obtain B1+ maps. An SNR was calculated using the Kellman method (see, e.g., Reference 25) from GRE acquisitions both with and without RF excitation, with flip angle calibrated in the spinal cord (e.g., TR/TE/Flip/BW=200 ms/4.07 ms/20°/300 Hz per pixel, Matrix=256*256, FoV=320 mm, Slice=3 mm). In-vivo turbo spin echo ("TSE") images were acquired in axial (e.g., TR/TE/BW/Slice=5410 ms/71 ms/238 Hz per pixel/2 mm, Matrix=512*512, FoV=200 mm, TF=8, 130° Refocusing, TA=6.36 mins) and coronal planes (TR/TE/BW/Slice=6100 ms/70 ms/238 Hz per pixel/2 mm, Matrix=512*512, FoV=256 mm, TF=8, 130° Refocusing, TA=9:17 mins Further Exemplary Results and Simulations Better than about −20 dB match was achieved for all elements in the exemplary array arrangement. Simulations achieved critical decoupling (e.g., S12<−25 dB) for the overlapped loopole elements. (See e.g., FIG. 18). S12 coupling between overlapped elements in offset loop array was less than about −20 dB. S12 coupling for the two elements of the dipole array was about −12 dB. Taking SAR as the limiting factor, B1+ maps were generated normalized by SQRT(peak 10 g SAR). (See, e.g., FIG. 21A). The exemplary loopole array achieved at least about a 35% improvement over compared designs for central B1+, because it exhibited lower peak SAR. The loopole array also achieved at least about 25% improvement in B1+ when normalized to square root of absorbed power. The loopole elements tiled along z (see e.g., FIG. 19) achieved critical decoupling (e.g., <−28 dB). Sagittal B1+ maps (see e.g., FIG. 22) indicate that although a single loopole element has a shorter z field of view than the about 37 cm dipole, with additional power, extended z loopole array can achieve similar or better coverage than the dipole array.

Further Exemplary Experiments

Figure 24A:
FIG. 24A is an image of in-vivo axial turbo spin echo ("TSE") images according to an exemplary embodiment of the present disclosure.
Figure 24B:
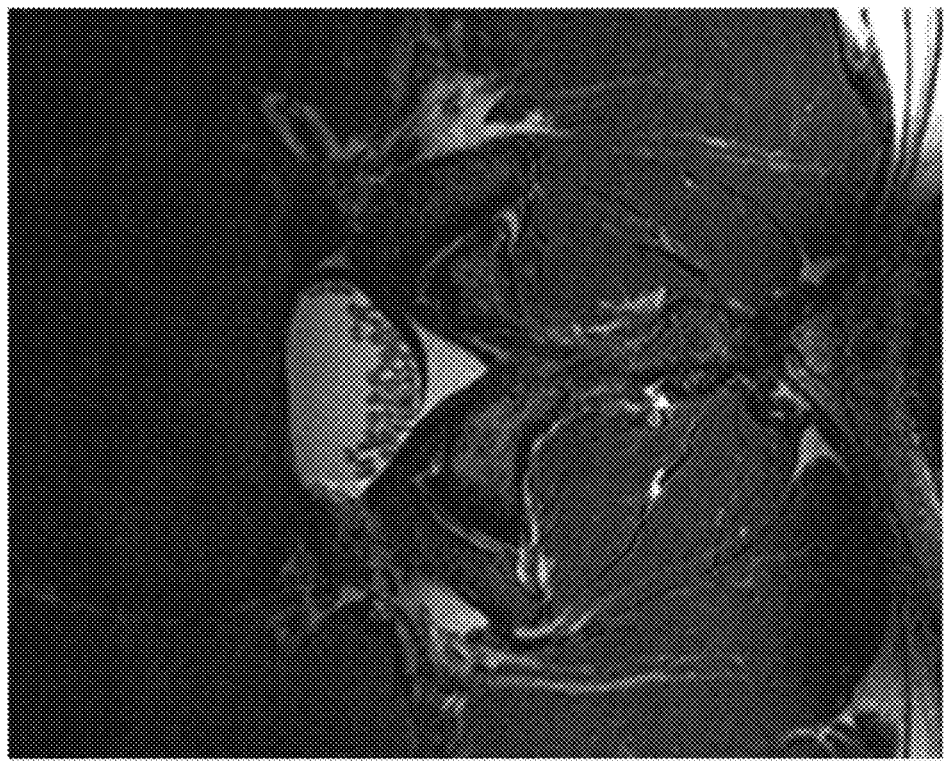
FIG. 24B is an image of in-vivo coronal TSE images according to an exemplary embodiment of the present disclosure.

The Unloaded & Loaded Q values for the loopole elements were about 80 & about 8 respectively. All elements were matched better than about −20 dB with isolation better than about −18 dB. Experimental phantom B1+ maps normalized to excitation voltage (see e.g., FIG. 21B) indicate that the loopole array achieved two-fold improvement in central B1+ efficiency over the offset loop array. In-vivo SNR maps (FIGS. 23A and 23B) indicate that the loopole array achieved on average about 15% SNR improvement in spinal cord and more than about 50% improvement in the disc compared to the offset loop array within the about 15 cm FoV of the loopole. A 65 degree flip angle in the spinal cord was achieved with the available power and standard RF pulses, which was sufficient to generate axial (see e.g., FIG. 24A) and coronal (see e.g., FIG. 24B) T2 weighted images. The in-vivo images demonstrate exquisite anatomical detail for the caudal equina nerve roots in the mid-lumbar spine. These images could significantly improve in-vivo characterization of foraminal and facet joint anatomy prior to spine interventions for pain.

Exemplary Conclusions and Discussion

With the exemplary array of large elements described herein, it can be possible to achieve substantial improvements in $B_1^+$, and/or SNR, through creating an unbalanced current distribution on the loops. Assuming that these exemplary elements can be capable of capturing magnetic and electric dipole fields, a maximum performance for a particular amount of unbalance can be achieved. Simulations show that loopoles can be overlapped in the z direction for improved coverage. Dense coil arrays can be engineered by overlapped and tiled loopoles, providing the convenience of loop coil design with the performance of electric dipoles.

Figure 17:
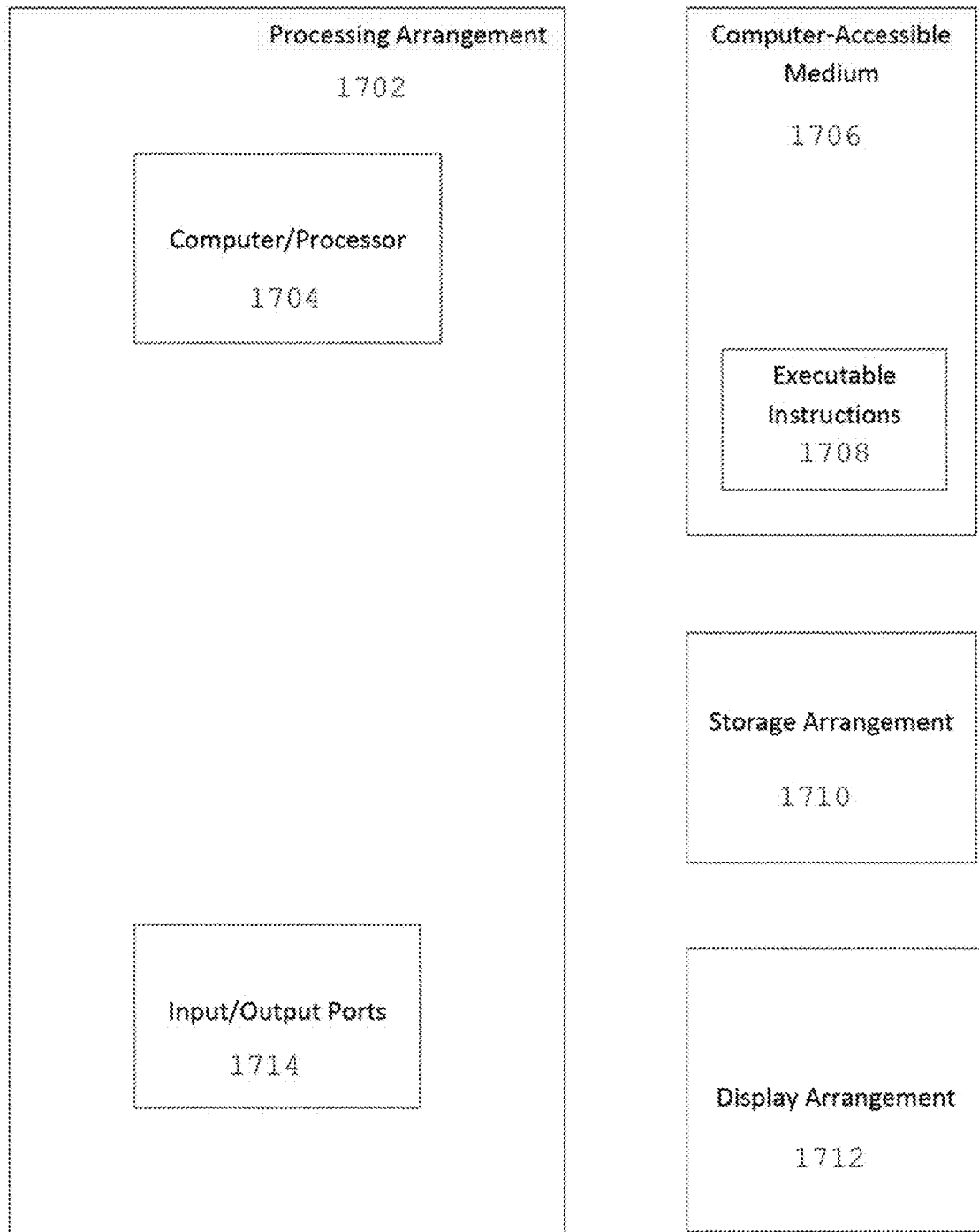
FIG. 17 is an illustration of an exemplary block diagram of an exemplary system according to an exemplary embodiment of the present disclosure.

FIG. 17 shows a block diagram of an exemplary embodiment of a system according to the present disclosure. For example, exemplary procedures in accordance with the present disclosure described herein can be performed by a processing arrangement and/or a computing arrangement 1702. Such processing/computing arrangement 1702 can be, for example entirely or a part of, or include, but not limited to, a computer/processor 1704 that can include, for example one or more microprocessors, and use instructions stored on a computer-accessible medium (e.g., RAM, ROM, hard drive, or other storage device).

As shown in FIG. 17, for example a computer-accessible medium 1706 (e.g., as described herein above, a storage device such as a hard disk, floppy disk, memory stick, CD-ROM, RAM, ROM, etc., or a collection thereof) can be provided (e.g., in communication with the processing arrangement 1702). The computer-accessible medium 1706 can contain executable instructions 1708 thereon. In addition or alternatively, a storage arrangement 1710 can be provided separately from the computer-accessible medium 1706, which can provide the instructions to the processing arrangement 1702 so as to configure the processing arrangement to execute certain exemplary procedures, processes and methods, as described herein above, for example.

Further, the exemplary processing arrangement 1702 can be provided with or include an input/output arrangement 1714, which can include, for example a wired network, a wireless network, the internet, an intranet, a data collection probe, a sensor, etc. As shown in FIG. 17, the exemplary processing arrangement 1702 can be in communication with an exemplary display arrangement 1712, which, according to certain exemplary embodiments of the present disclosure, can be a touch-screen configured for inputting information to the processing arrangement in addition to outputting information from the processing arrangement, for example. Further, the exemplary display 1712 and/or a storage arrangement 1710 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, for example, data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety.

EXEMPLARY REFERENCES

The following references are hereby incorporated by reference in their entirety.

[1] Raaijmakers A J E. ISMRM 2013 p. 4382.
[2] Wiggins G. ISMRM 2012:541.
[3] Graessl A. ISMRM2013:0395.
[4] Raaijmakers A J E. Magn. Reson. Med. 2011 66(5): 1488-97.
[5] Lattanzi R. MRM 68:286-304 (2012)
[6] Kellman P. Magn Reson Med 2005 54(6):1439-47.
[7] Zhang B. ISMRM 2012:2816.
[8] Horner F. Properties of Loop Aerials, The Wireless Engineer, Vol. 25, August 1948 pp. 254-259.
[11] Lattanzi R. MRM 68:286-304 (2012)
[12] Schnell W. (2000), IEEE Trans Ant Prop 48:418-28.
[13] Wiggins G. ISMRM 2013 p. 2737.
[14] Eryaman Y. ISMRM 2013 p. 393.
[15] Klose U, Med. Phys. 19 (4), 1992.
[16] Yarnykh V. MRM 57:192-200 (2007).
[17] [1] Horner F. Properties of Loop Aerials, The Wireless Engineer, Vol. 25, August 1948 p 254-259
[18] [2] Lakshmanan K. ISMRM 2014 p 0397
[19] [3] Lakshmanan K. ISMRM 2014 p 0315
[20] [4] Wiggins G. ISMRM 2013 p 2737
[21] [5] Lee W. ISMRM 2013 p 4367
[22] [6] Duan Q. ISMRM 2010 p 51
[23] [7] Duan Q. ISMRM 2014 p 0316
[24] [8] Wiggins G ISMRM 2009 p 2951.
[25] [9] Kellman P. MRM 54:1439-1447 (2005)

What is claimed is:

1. An antenna arrangement, comprising:
at least one surface coil loop conductor and a plurality of capacitors coupled to the at least one surface coil loop conductor, the capacitors being configured to facilitate an unbalanced current flow when the at least one surface coil loop conductor is excited by a radio frequency (RF),
wherein the at least one surface coil loop conductor and the plurality of capacitors are configured to cause a transmission of an electromagnetic radiation from a magnetic resonance imaging (MRI) apparatus to a body.

2. The antenna arrangement of claim 1, wherein the at least one surface coil loop conductor is configured to generate unbalanced current flow when excited by a radio frequency.

3. The antenna arrangement of claim 1, wherein the arrangement has a substantially planar configuration.

4. The antenna arrangement of claim 1, wherein the at least one surface coil loop conductor is a substantially flat conductor strip formed into a circle.

5. The antenna arrangement of claim 1, wherein the at least one surface coil loop conductor is formed from a substantially linear dipole structure.

6. The antenna arrangement of claim 1, wherein the at least one surface coil loop conductor includes a plurality of surface coil loop conductors spaced apart from one another.

7. An antenna arrangement, comprising:
at least one surface coil loop conductor and a plurality of capacitors coupled to the at least one surface coil loop conductor, the capacitors being configured to facilitate an unbalanced current flow when the at least one surface coil loop conductor is excited by a radio frequency (RF); and
at least one transmit coil and at least one receive coil each of which is configured to interact with a magnetic resonance imaging apparatus.

8. The antenna arrangement of claim 7, wherein the at least one surface coil loop conductor is configured to generate unbalanced current flow when excited by a radio frequency.

9. The antenna arrangement of claim 7, wherein the arrangement has a substantially planar configuration.

10. The antenna arrangement of claim 7, wherein the at least one surface coil loop conductor is a substantially flat conductor strip formed into a circle.

11. The antenna arrangement of claim 7, wherein the at least one surface coil loop conductor is formed from a substantially linear dipole structure.

12. The antenna arrangement of claim 7, wherein the at least one surface coil loop conductor includes a plurality of surface coil loop conductors spaced apart from one another.

13. An antenna arrangement, comprising:
at least one surface coil loop conductor and a plurality of capacitors coupled to the at least one surface coil loop conductor, the capacitors being configured to facilitate an unbalanced current flow when the at least one surface coil loop conductor is excited by a radio frequency (RF);
wherein the at least one surface coil loop conductor includes a plurality of surface coil loop conductors overlapping one another.

14. The antenna arrangement of claim 13, wherein the at least one surface coil loop conductor is configured to generate unbalanced current flow when excited by a radio frequency.

15. The antenna arrangement of claim 13, wherein the arrangement has a substantially planar configuration.

16. The antenna arrangement of claim 13, wherein the at least one surface coil loop conductor is a substantially flat conductor strip formed into a circle.

17. The antenna arrangement of claim 13, wherein the at least one surface coil loop conductor is formed from a substantially linear dipole structure.

18. The antenna arrangement of claim 13, wherein the at least one surface coil loop conductor includes a plurality of surface coil loop conductors spaced apart from one another.

19. An antenna arrangement, comprising:
at least one surface coil loop conductor and a plurality of capacitors coupled to the at least one surface coil loop conductor, the capacitors being configured to facilitate an unbalanced current flow when the at least one surface coil loop conductor is excited by a radio frequency (RF);
wherein the capacitors are coupled to the at least one surface coil loop conductor at least one of (i) in a long feed leg, (ii) on an opposite long leg, (iii) in one short leg, or (iv) in two short legs.

20. The antenna arrangement of claim 19, wherein the at least one surface coil loop conductor is configured to generate unbalanced current flow when excited by a radio frequency.

21. The antenna arrangement of claim 19, wherein the arrangement has a substantially planar configuration.

22. The antenna arrangement of claim 19, wherein the at least one surface coil loop conductor is a substantially flat conductor strip formed into a circle.

23. The antenna arrangement of claim 19, wherein the at least one surface coil loop conductor is formed from a substantially linear dipole structure.

24. The antenna arrangement of claim 19, wherein the at least one surface coil loop conductor includes a plurality of surface coil loop conductors spaced apart from one another.

* * * * *